United States Patent [19]

Owen

[11] Patent Number: 5,691,666

[45] Date of Patent: Nov. 25, 1997

[54] FULL THRESHOLD FM DEVIATION COMPRESSION FEEDBACK DEMODULATOR AND METHOD

[76] Inventor: Joseph C. Owen, 302 Mill St., Box 97, Seven Mile, Ohio 45062

[21] Appl. No.: 481,931

[22] Filed: Jun. 7, 1995

[51] Int. Cl.⁶ .................. H03D 3/06; H03D 7/16
[52] U.S. Cl. .............. 329/319; 329/325; 455/208; 455/209; 455/266; 455/316
[58] Field of Search .................. 329/319, 325, 329/326, 318; 455/208, 209, 210, 214, 266, 313, 314, 316, 337

[56] References Cited

U.S. PATENT DOCUMENTS

| | | | |
|---|---|---|---|
| 2,075,503 | 3/1937 | Chaffee | 455/42 |
| 2,272,401 | 2/1942 | Chaffee | 455/210 |
| 2,969,459 | 1/1961 | Hem | 455/210 |
| 3,001,068 | 9/1961 | Morita et al. | 455/209 |
| 3,231,822 | 1/1966 | Tillotson | 455/208 |
| 3,541,451 | 11/1970 | Lind | 455/208 |
| 3,792,357 | 2/1974 | Hekimiam et al. | 455/43 |
| 4,087,756 | 5/1978 | Rogers, Jr. | 329/325 |
| 4,339,828 | 7/1982 | Chasek | 455/205 |
| 4,563,651 | 1/1986 | Ohta et al. | 329/318 |
| 4,594,556 | 6/1986 | Ohta | 329/319 |
| 4,698,598 | 10/1987 | Mobley et al. | 329/319 |
| 5,034,695 | 7/1991 | Owen | 329/325 |
| 5,339,463 | 8/1994 | Hanson | 455/213 |

*Primary Examiner*—Siegfried H. Grimm
*Attorney, Agent, or Firm*—Longacre & White

[57] ABSTRACT

A FM (Frequency Modulated) DCFB (Deviation Compression Feedback) signal demodulator can be achieved by utilizing FM deviation compression feedback techniques. An FM signal is coupled to a mixer (10) wherein a signal from a local oscillator is mixed with the input signal. The output of the mixer is then coupled to a variable selective IF amplifier. The IF amplifier couples the signal to a limiter amplifier, the output of the limiter amplifier is FM demodulated and fed to an output. The output signal is simultaneously fed back through a variable Frequency Compensation Network (FCN) (Loop Filter). The output signal of the FCN is then fed back to a local oscillator (17). The output of the local oscillator (17) is in turn fed back into the original mixer (10). The improved demodulated signal is sampled at an output (26).

23 Claims, 6 Drawing Sheets

5,691,666

FULL THRESHOLD FM DEVIATION COMPRESSION FEEDBACK DEMODULATOR AND METHOD

BACKGROUND OF THE INVENTION

The use of threshold extension is becoming more widespread in FM signal usage. A need for a "new and improved" demodulator affording full threshold extension and greatly improved reliability has become evident. Over the years it has been common to use phase detectors and phase locked loops in threshold extension applications. Certain barriers prevented optimum threshold extension. However, using a novel approach to solving these barriers lead to a new and unique way of demodulating FM in a deviation compression feedback FM demodulator, and now the use of narrower bandpass filters in the IF stages and higher feedback loop gains is possible, permitting the fullest threshold extension possible. The effects of narrower bandpass filters and higher feedback loop gain can be better understood in two publications entitled "Phase Locked Loops & Their Applications" by D. D. Carpenter, IEEE Press 1979, pages 178–181, and "Feedback and Control Systems" by A. C. McDonald/H. Lowe, Reston Publishing Co., Inc. 1981; pages 285–351 and 376–381; each of these provide insight to the effects of narrow band pass IF stages and high feedback loop gains. While other threshold extension demodulators provide a degree of improvement over conventional FM demodulators and especially conventional quadrature demodulators, there is still a need for a full threshold demodulator, and especially one providing a high degree of reliability and simplicity. A prior example of a full threshold demodulator is discussed in U.S. Pat. No. 5,034,695, of which I am the inventor and which is incorporated herein by reference.

SUMMARY OF THE INVENTION

In the instant invention, a signal containing FM of a prescribed FM deviation is mixed with a local oscillator to produce a converted IF signal now having a reduced FM deviation. This signal is selectively filtered in variable band width IF amplifier stage(s) removing broadband noise and passing only a very narrow band containing the desired converted IF signal of reduced FM deviation.

The received signal conditions are evaluated, converted to a control signal, and used by the bandwidth control to determine the bandwidth of the variable bandwidth IF amplifier. The converted IF signal is then AGC amplified or limited by a limiter amplifier before it is FM demodulated. A feedback loop is formed by feeding the demodulated output signal back to the local oscillator to control its frequency in a fashion as to closely track the incoming signal in order to compress the incoming signal FM deviation at the output of the mixer.

The feedback loop is used to reduce the FM deviation of the received input signal to a much lower FM deviation in order that very narrow bandpass in the variable IF amplifier stage(s) does not generate distortion of the IF signal. The feedback loop extends receiver demodulation bandwidth characteristics permitting the use of narrow bandpass filters in the IF stages. A variable De-Emphasis Frequency Compensation Network (Loop Filter) is utilized to further reduce unwanted distortions and to reduce the closed loop demodulation bandwidth under less favorable receiving conditions thereby extending usable receiver sensitivity. As before the signal receiving conditions are evaluated and used by the bandwidth control to vary the variable De-Emphasis loop filter.

DESCRIPTION OF THE PREFERRED EMBODIMENT

Figure 1:
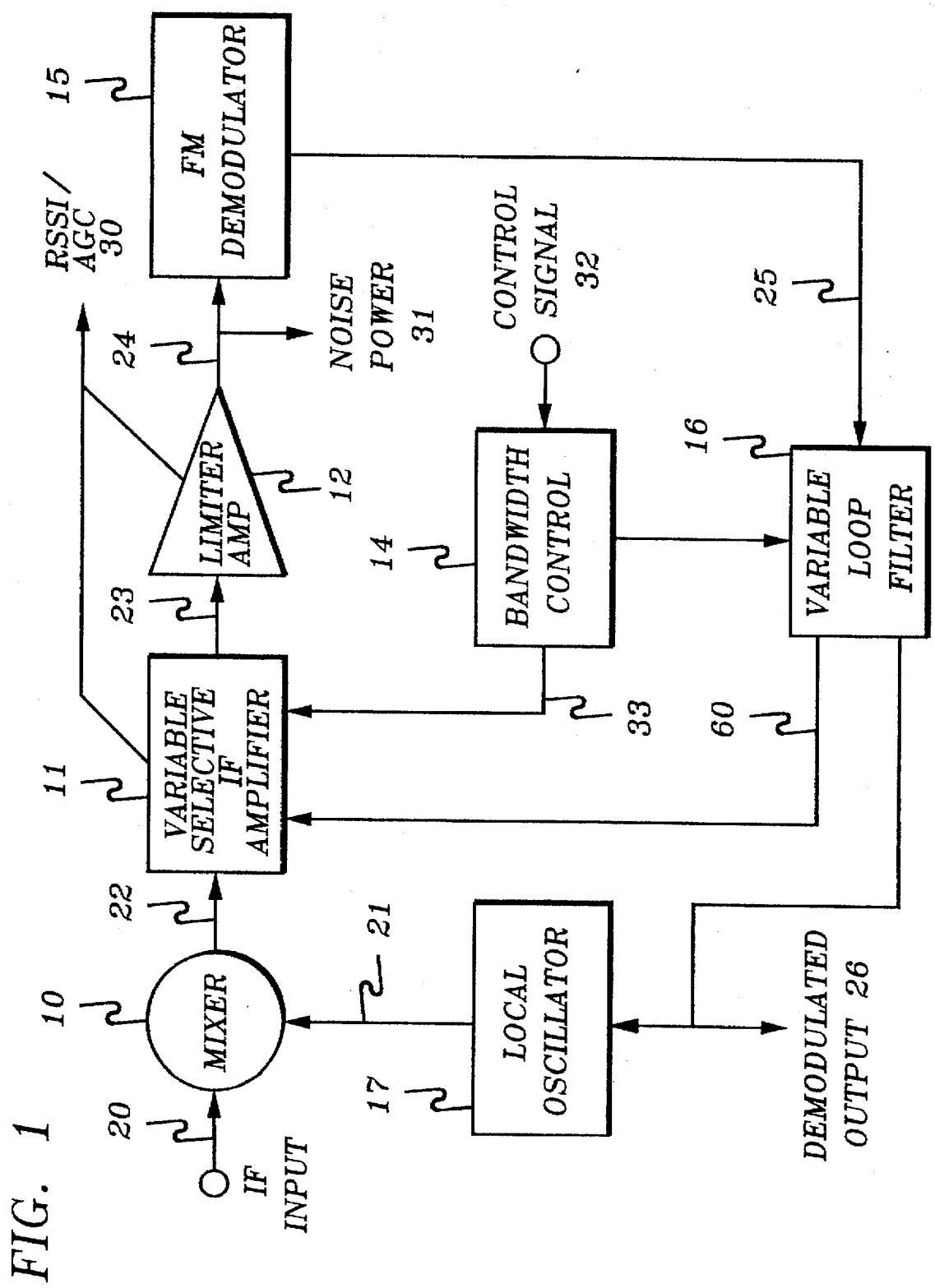
FIG. 1 is a schematic block diagram of an embodiment of an FM deviation compression feedback FM demodulator according to the present invention.

The present invention works on the principle that whatever the demodulation bandwidth is, the noise bandwidth is two times this value. Regular FM stereo demodulation has a noise bandwidth of 280 KC. The U.S. Pat. No. 5,034,695 reduces this noise bandwidth down to as low as 106 KC (2×53 KC), if a lead compensation filter is used before the stereo demodulator to improve stereo channel separation. The present design is variable from 106 KC down to less than 40 KC, and preferably less than 30 KC, and can increase stereo sensitivity by more than 2.6 times. Additionally, if the demodulation bandwidth is reduced as signal strength is reduced, a good balance between noise and demodulation bandwidth can still be achieved. Variable feedback gain within the deviation compression loop can reduce demodulation bandwidth as shown in U.S. Pat. No. 3,231,822, but it also reduces feedback gain needed to reduce FM deviation within the IF, preventing distortion. Therefore, if a variable frequency compensation filter (loop filter) is used instead, it is possible to reduce unwanted distortion caused by overdeviation in the IF and also control noise bandwidth. The variable frequency compensation filter can be a proportional- plus-integral type (P+I) controller having one pole and one zero. The zero of the compensation filter may cancel the pole of the band pass filter. Other compensation filters will also work. It may include two parallel filters that are connected together with a variable resistance like an FET transistor connected between them. The new filter value becomes lower than the original by an amount determined by the component values chosen. The voltage variable frequency compensation filter is varied as the FET electronically blends the two filters into one by the control signal level.

As demodulation frequency increases the amount of feedback decreases at a slope of 6 dB per octave. The effect of the Proportional plus Integral (P+I) filter is to reduce the feedback signal controlling the voltage-controlled oscillator at higher demodulation frequencies, while increasing the feedback signal at lower demodulation frequencies. The reduction of feedback signal to the oscillator causes the deviation in the IF to increase and vice versa. This causes a deviation slope of the IF amplifier in the same way modulation as a pre-emphasis. Therefore a de-emphasis in the feedback loop causes a pre-emphasis in the IF. Deviation in the IF decreases as the demodulation frequency decreases at a 6 dB per octave slope. Since the deviation at lower demodulation frequencies is lower, the distortion is therefore also lower. Using only a single two pole band pass filter in the IF combined with only a single pole, single zero, P+I filter in the feedback loop provides optimum circuit performance. The poles of the FM demodulator are usually set high enough that they do not adversely affect the performance of the feedback circuit. This invention uses deviation slope in the IF amplifier with the intent of reducing distortion in a deviation compression feedback demodulator.

According to the invention, using an ultra-narrow bandpass filter in the IF is optimum. For FM stereo, the deviation in the IF is peak at about 15 KC of audio modulation. This designed peak at 15 KC is due to an FCC standardized 75 MS modulation pre-emphasis. If the IF filter is reduced to 30 KC the deviation will be maximum at this IF bandwidth and can cause distortion if a P+I filter is not used. There is evidence that reducing the IF bandwidth below 30 KC (i.e., less than 10 KC), may help reduce this distortion. If active bandpass filters are contained within the demodulator, the door is open for having a single IC chip made with few external components.

According to the present invention, you trade off demodulation bandwidth for lower noise bandwidth. However, since this is better than losing the signal altogether, it is still the best option.

Receiver sensitivity follows this relationship:

Receiver sensitivity improvement=(normal demodulation bandwidth÷reduced demodulation bandwidth)½

This variable bandwidth demodulator outperforms a variable bandwidth phase locked loop demodulator in sensitivity, noise performance, dynamic range and stability. This demodulator design could also be used in the cellular car phone field of technology. Another potential technological use I have not mentioned is the Spread Spectrum communications field that is just beginning to receive attention. This new design would improve both Spread Spectrum and Ham Radio.

FIG. 1 illustrates a block diagram of the FM deviation compression feedback demodulator of the present invention. The deviation compression feedback demodulator is adapted to be attached to existing FM receiving equipment or to be implemented in latter designs in order to provide full threshold extension of standard FM receivers.

The FM deviation compression feedback demodulator of the present invention of FIG. 1 receives an FM signal input of a prescribed FM deviation at mixer 10 input at 20 and mixes with local oscillator 17 output at mixer 10 input at 21 producing a converted IF signal at mixer 10 output 22 having a prescribed reduced FM deviation. The signal of reduced FM deviation is then passed through variably selective IF amplifier 11, where it is selectively filtered of broad band noise yet passing the IF signal undistorted. The bandwidth of the selective IF amplifier is made wide enough as to avoid unwanted selective filtering of the desired IF signal yet narrow as possible as to remove as much broad band noise as possible. The selectively filtered IF signal 23 of a prescribed reduced FM deviation is further amplified and limited in limiter amplifier 12 and fed to an FM demodulator 15. It is FM demodulated and fed to an output 25 (demodulation frequency). A feedback loop is formed by feeding the demodulated signal output 25 through variable frequency compensation network (P+I Filter) 16 back to local oscillator 17 for controlling oscillator 17 in a fashion as to closely track the FM signal input 20 in a manner of which reduces the FM deviation of the converted IF signal to a reduced FM deviation. The demodulated signal output 26 used to track the local oscillator 17 is then an accurate demodulation of the received FM signal input 20.

Figure 2:
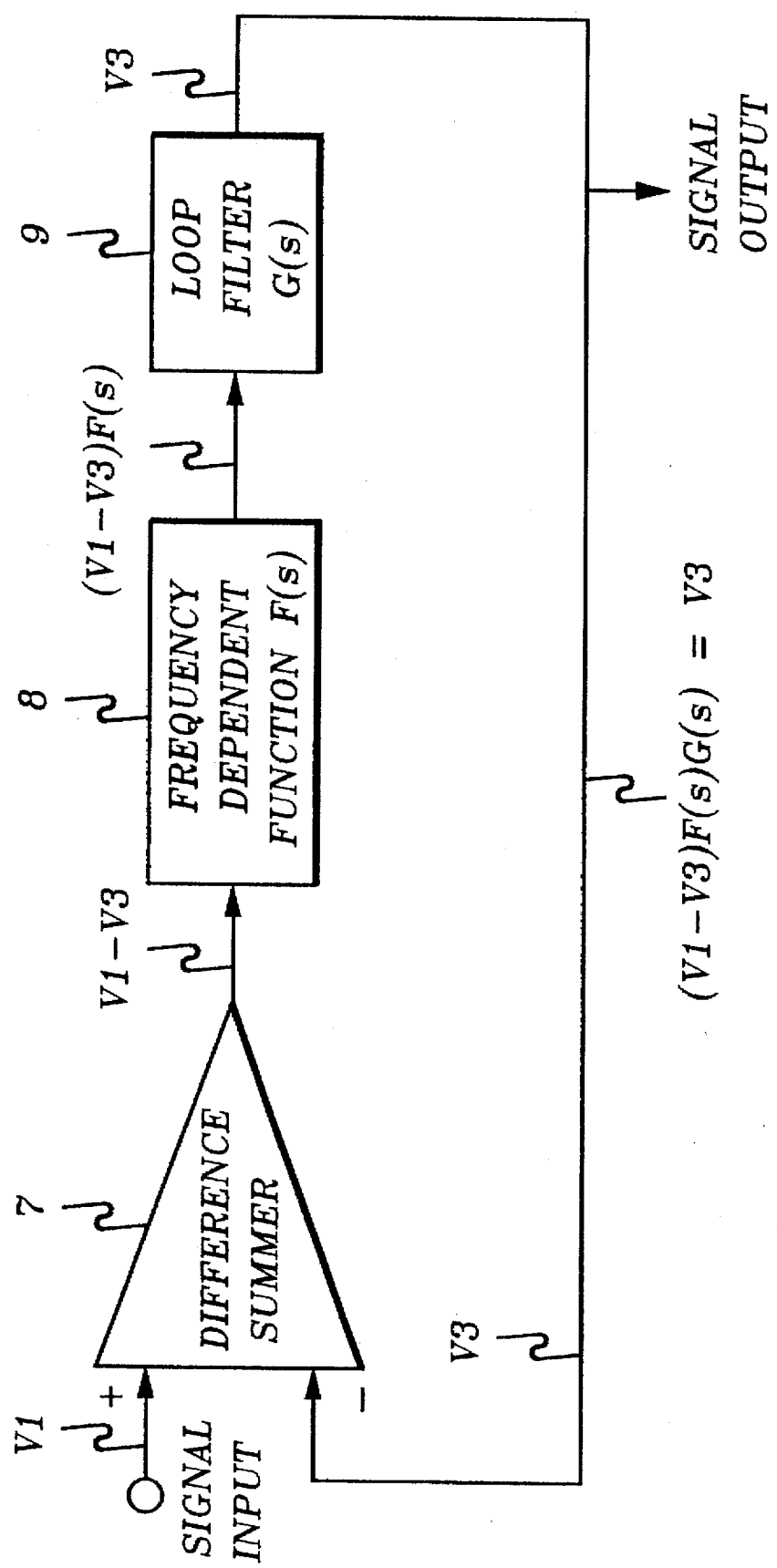
FIG. 2 is the electrical diagram of a model used in demonstrating the relationship of large feedback on a demodulation system response.

In order to fully understand the present invention it is important to understand the principles behind each feedback loop. FIG. 2 represents a simple model to assist in understanding the effect of large amounts of feedback upon a system having frequency dependent characteristics such as a bandpass filter passing a FM signal.

The signal input V1 is added with the inverted signal output V3 in summer 7 forming V1-V3 which passes through F(s) function. The resultant signal is then amplified by compensation (P+I) filter 9 by the amount G(s) forming the signal (V1-V3)F(s)G(s) being the output signal V3.

Therefore:

V1=Input Signal Voltage (time varying)
V3=Output Signal Voltage (time varying)
G(s)=Loop Filter gain (frequency dependent)
F(s)=Frequency Dependent Function (freq. depend.)
w=Radian Frequency=2(PI)F
s=Sigma+jw (j being imaginary number)

And it can be seen that V3=(V1-V3)F(s)G(s). Equating for V3/V1 gives the closed feedback loop system frequency response of;

$$V3/V1 = \frac{F(s)G(s)}{F(s)G(s)+1} = \frac{1}{(1/F(s)G(s))+1}$$

It can be seen from this equation that increasing the filter gain G(s) causes 1/F(s)G(s) to decrease until as G(s) is increased toward infinity where 1/F(s)G(s) goes toward zero, and in return the quotient V3/V1 approaches unity and the amount of signal permitted to pass through frequency dependent function 8 approaches zero (virtual ground at V1-V3).

Thus large amounts of feedback produces a very flat closed loop frequency response of the system, greatly extending its frequency response and essentially removing most of the effects of the system F(s).

It follows then that using large amounts of feedback in the instant invention improves the demodulator's closed loop demodulation bandwidth considerably even when very narrow bandpass filters are used in the IF stages(s). The use of an appropriate frequency compensation network (Loop Filter) will provide the flattest demodulation bandwidth possible. Utilizing a variable bandwidth bandpass filter in the IF in conjunction with a variable frequency compensation filter optimizes the demodulation bandwidth and noise bandwidth for the particular receiving conditions. Reducing the demodulation bandwidth and IF bandwidth thereby reduces noise bandwidth and improves receiver sensitivity and selectivity.

The bandwidth control signal can be derived from any number of sources such as Received Signal Strength Indicator (RSSI), automatic gain control (AGC), noise power, carrier to noise (C/N), etc. The signal can be used to reduce the circuit Q of the selective IF amplifier and/or move the zero frequency of the variable frequency compensation network (loop filter). Under weak signal conditions the process would be reversed, the circuit Q would be raised and the zero would be moved back.

Figure 3:
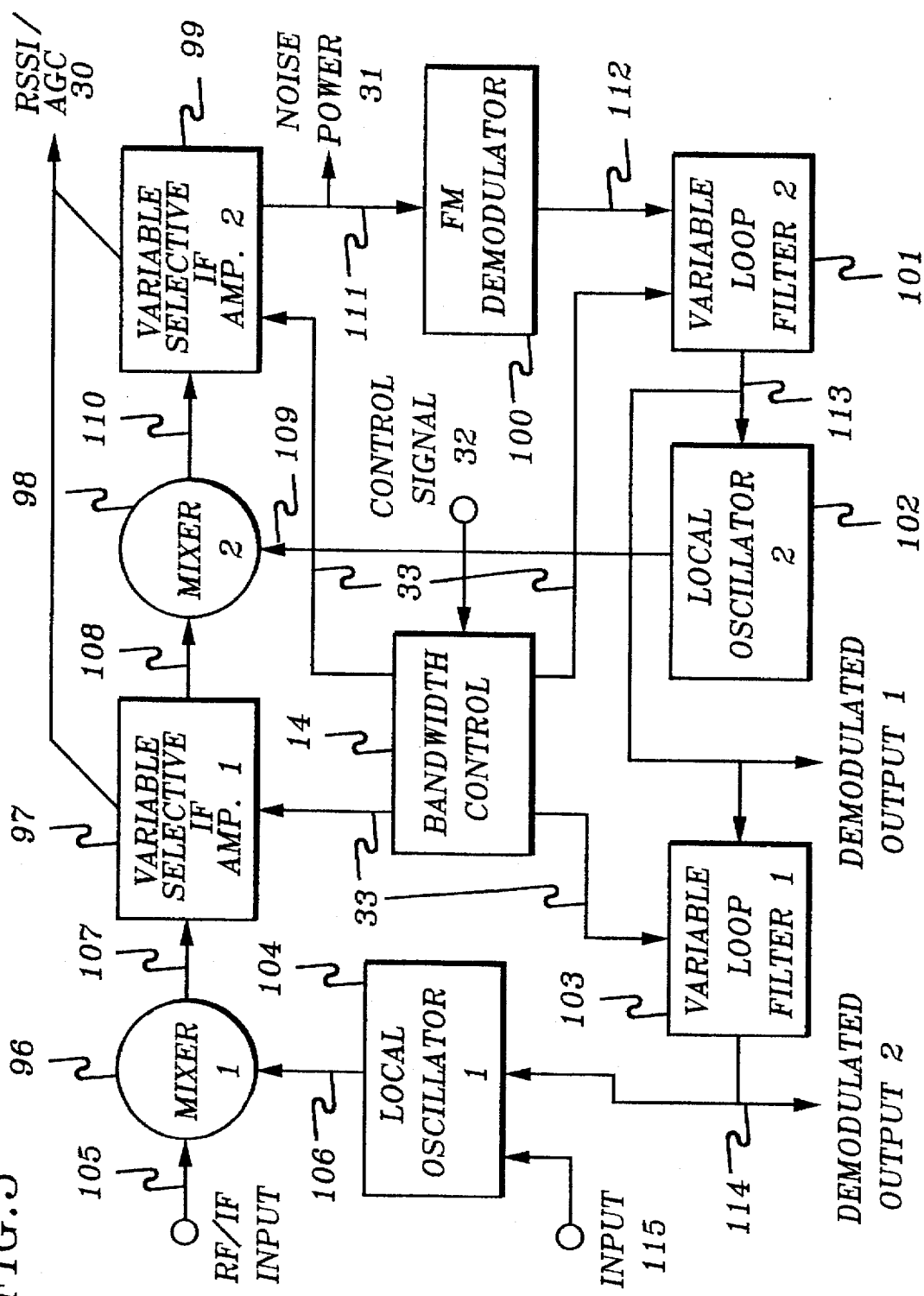
FIG. 3 is a schematic block diagram of an FM deviation compression feedback FM demodulator utilizing multiple mixer means according to the present invention.

In a preferred embodiment of FIG. 3, a first mixer 96 receives an input FM signal of a prescribed FM deviation at input 105 and an input 106 from first local oscillator 104.

The first mixer 96 converts the input FM signal of prescribed FM deviation to a first IF signal having a first prescribed reduced FM deviation which is output at 107. The first local oscillator 104 moderately tracks the received input FM signal in order that the FM deviation of the converted first IF signal is moderately reduced permitting the use of a narrower bandpass in the first selective IF amplifier 97 than would otherwise be required. The bandpass which may include a variable bandwidth bandpass is maintained as to not degrade the desired demodulation bandwidth of the received signal and yet still improving selectivity. After being amplified and selectively filtered in first selective IF amplifier 97, the signal is then fed to the input 108 of second mixer 98 where it is mixed with an output 109 from second local oscillator 102 and output from second mixer 98 at output 110. The output at 110 is a second IF signal having a second prescribed reduced FM deviation. The second local oscillator 102 is tracked very closely to the frequency of the first IF signal thereby greatly reducing the FM deviation of the converted second IF signal. A second control input 115 is provided at first local oscillator 104 for band switching or rapid tuning of the local oscillator to permit reception of multiple signal input bands or channels.

The second IF signal of greatly reduced FM deviation at output 110 then passes through the second selective IF amplifier 99. This amplifier 99 may include a variable bandpass having a very narrow bandwidth so that as much broad band noise is removed as possible yet not adversely affecting the second IF signal. After selectively filtering in the second selective IF amplifier, the second IF signal is demodulated in FM demodulator 100 producing a demodulated output 112.

Two FM deviation compression feedback loops are employed in the instant preferred embodiment of FIG. 3. A first feedback loop feeds FM demodulator 100 output 112 through second variable frequency compensation network 101 and then first variable frequency compensation network 103 back to first local oscillator 104 input 114 for controlling its frequency so as to moderately track the received FM input signal at first mixer 96 input 106 in a fashion as to reduce the FM deviation of the converted first IF signal to a prescribed reduced FM deviation. A second feedback loop feeds FM demodulator 100 output 112 through second variable frequency compensation network (Loop Filter) 101 back to second local oscillator 102 input 113 for controlling its frequency so as to closely track the first IF signal at second mixer 98 input 109 in a fashion as to greatly reduce the FM deviation of the converted second IF signal to a prescribed greatly reduced FM deviation. The demodulated signal from network 101 appearing at output 113 and controlling second local oscillator 102 is an accurate demodulation of the original FM signal input.

Referring to FIG. 3 the bandwidth control is shown controlling four circuit blocks. This circuit may include operational amplifier filters or OP AMP filters for short. They will amplify and further filter the derived DC signal and control each circuit as needed. They may provide level shifting to match each circuit to the control signal levels in order to optimize system performance. Bandwidth control 14 may not be necessary to control the bandwidths of the variable selective IF amplifiers. Also shown is variable loop filter 2 supplying signal to variable loop filter 1 but, filter 1 could just as easily be fed directly from the FM demodulator. By cascading them it may be possible to obtain the desired effect without controlling both variable loop filters. It may only have to control filter 2.

Figure 6:
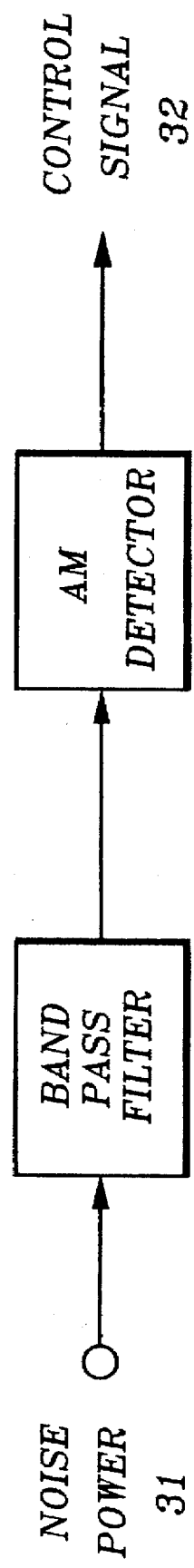
FIG. 6 is a schematic block diagram of an alternative embodiment of an AM demodulator used in an embodiment according to the present invention.

The bandwidth control signal 32 can be derived from many sources. The best system is to measure the IF signal bandwidth used by the compressed deviation IF signal just before it is FM demodulated. The normal bandwidth of this signal under no noise conditions is very narrow (usually under 50 KC of deviation). Under noisy conditions this deviation increases considerably. This can be easily detected by using a narrow bandpass filter followed by an AM demodulator (FIG. 6). Under no noise conditions the narrow bandpass filter amplitude remains relatively constant and maximum. Whereas, under noisy conditions the output decreases because the deviation falls outside of the bandwidth of the narrow bandpass causing the output to decrease. The AM demodulator detects the decrease and drives the bandwidth control circuit to reduce the FM demodulator's demodulation bandwidth. The AM demodulator can be a simple diode partially biased in the conductive state and connected to a low pass filter used to reduce unwanted signal variations. The IF signal passing through the bandpass filter is half wave rectified, filtered and sent to the bandwidth control. This is a very precise control and unlike other received signal condition detectors, this one is insensitive to signal strength if preceded by a limiter or other constant energy device. It measures actual signal conditions.

Figure 4:
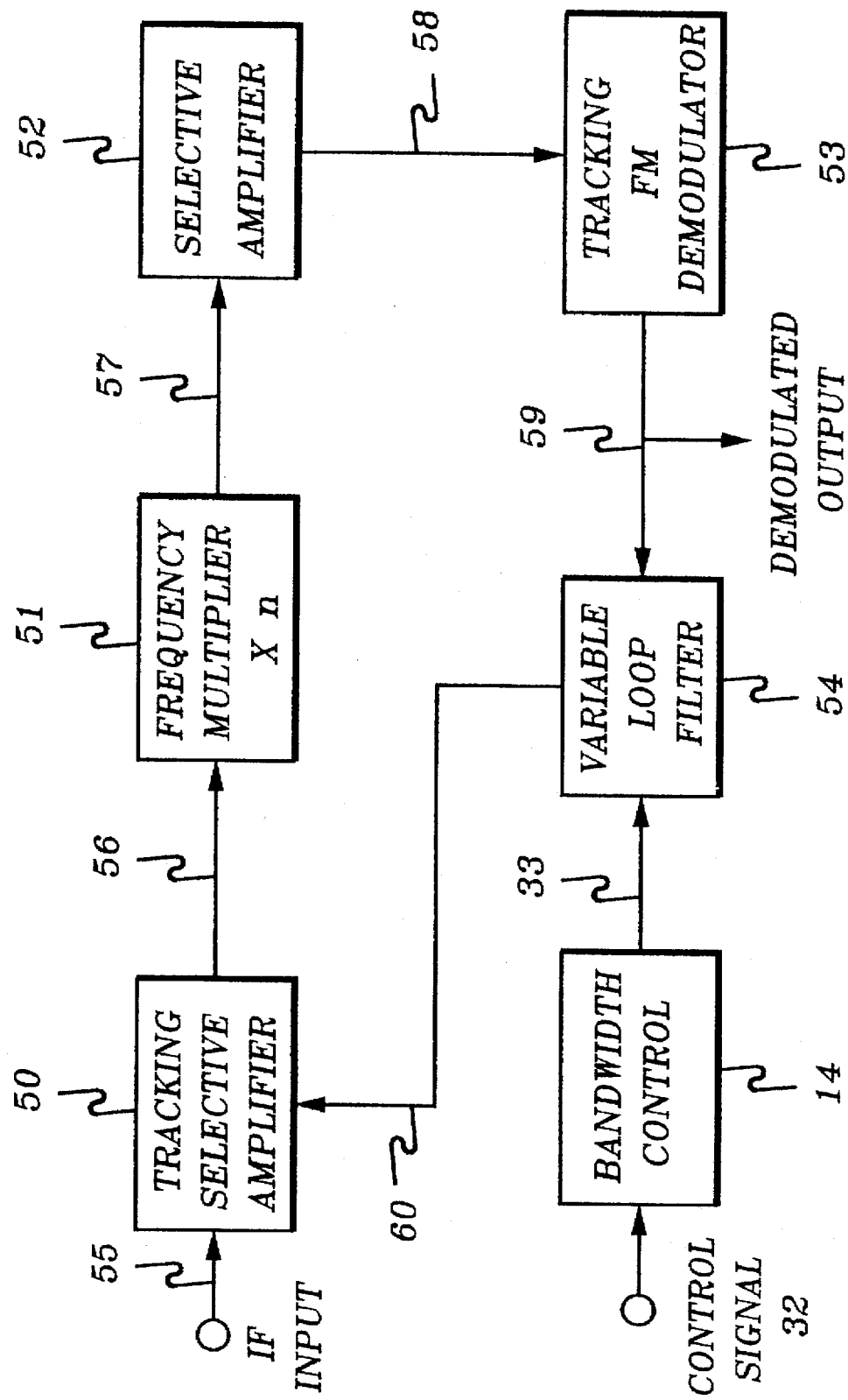
FIG. 4 is a schematic block diagram of an alternative embodiment of an FM deviation compression feedback FM demodulator according to the present invention.

Referring now to FIG. 4, an input signal of prescribed FM deviation is input to tracking selective amplifier 50 input 55 where it is amplified and selectively filtered removing as much noise as possible. The output of amplifier 50 is input to frequency multiplier xn 51 at input 56. It is multiplied by the integer n and fed to selective amplifier 52 input 57. The output of amplifier 52 is then FM demodulated by tracking FM demodulator 53 and fed to an output 59. Demodulated output 59 is variably frequency compensated in variable frequency compensation filter 54 and is fed back to tracking selective amplifier 50 input 60 in a fashion as to track the input signal of prescribed FM deviation at input 55. Variable frequency compensation filter 54 may be a variable pole filter or similar filter that will permit the tracking selective amplifier to be tracked at lower modulating frequencies and track less as the modulating frequency increases (de-emphasis). The bandwidth control and function of the variable frequency compensation filter are similar to that already described.

If the input signal deviation at input 55 was 150 KC, the deviation at 57 would be multiplied by integer n and would therefore be 450 KC. Selective amplifier 52 would have a bandwidth about two times 450 KC or about 900 KC. Tracking selective amplifier 50 would have as narrow a bandwidth as possible. Tracking FM demodulator 53 could be similar to that of FIG. 3. A bandwidth control may also be used in FM demodulator 53.

Figure 5:
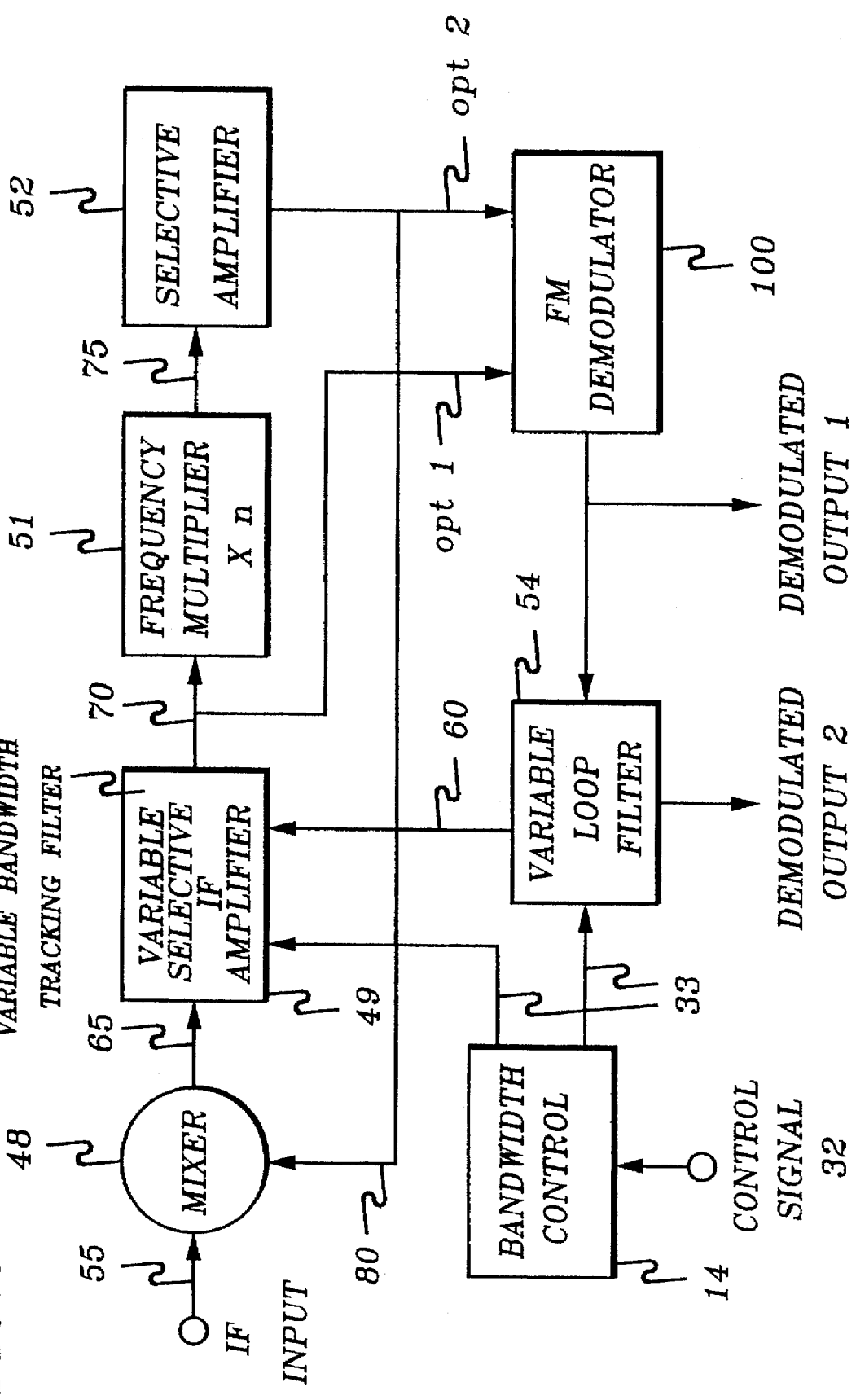
FIG. 5 is a schematic block diagram of an alternative embodiment of an FM deviation compression feedback FM demodulator according to the present invention.

Referring now to FIG. 5, an input signal of prescribed FM deviation is input to mixer 48 input 55. Mixer output is filtered in variable selective amplifier 49 input 65 and is output to frequency multiplier xn 51 input 70 and may also be output to FM demodulator 100 optional input 1. Frequency multiplier xn is output to selective amplifier 52 input 75 selectively filtered and is fed back to mixer 48 input 80 in a fashion as to track the input signal at input 55 and may also be output to FM demodulator 100 as an optional input 2. After FM demodulation in FM demodulator 100, the demodulated output is supplied to an output 1. Output 1 is input to variable frequency compensation filter 54 and fed back to variable selective amplifier 49 input 60 in a fashion as to track the signal frequency deviation at input 65. Variable selective amplifier 49 is both a variable frequency (input 60), and/or variable bandwidth (input 33) selective amplifier. Once again the bandwidth control functions similar to that previously described. Features of FIGS. 4 & 5 might be used in each of the other embodiments.

Processed IF signal 55 appearing at mixer input 80 is feedback used to reduce the FM deviation of the IF signal at 65 to a lower FM deviation. The frequency multiplier xn 51 multiplies the IF FM deviation at 70 by integer n. This multiplies the FM deviation at 80 by the integer n as well. The resulting FM deviation reduction at 65 is (xn+1). This permits a very narrow band pass within variable selective amplifier 49. Variable frequency compensation filter 54 functions similar to that previously described except it has an output 2 provided having a flat demodulated output frequency response. Demodulated output 2 may not be needed if demodulated output 1 is sufficient.

The frequency multiplier 51 can be used in the design to multiply or divide the FM deviation of the IF signal. This feature multiplies the amplitude of the noise and the FM deviation by the amount n. The FM demodulator in FIG. 5 can be driven by either option 1 or 2 depending on the particular application. Option 1 has the most deviation compression (xn+1). In FIG. 4 the deviation is actually multiplied by the amount xn.

A disadvantage exists, however, in using the IF signal to compress the FM deviation in this way. There is no slope on the deviation compression as there is in the first system of FIG. 3. The compression is flat over the demodulation bandwidth. In order to overcome this, the variable frequency selective amplifier can be used to track the IF signal with the needed slope. This variable frequency selective filter amplifier may be similar to that found in U.S. Pat. No. 3,541,451 except not double tuned. At low demodulation frequencies the tracking is highest and vice versa.

A very wide range of applications is possible with the preferred embodiments. For example, if the preferred embodiment of FIG. 1 was used to demodulate commercial FM stereo, the FM signal input 20 would customarily be 10.7 MC with a peak FM deviation of 150 KC. The input signal would mix in mixer 10 with local oscillator 17 at input 21 producing for the example a 2.0 MC IF signal at mixer 10 output 22 having a greatly reduced FM deviation. The IF signal is then selectively filtered in selective IF amplifier 11 having a bandwidth of 30 KC, for example, which would remove a very large amount of broadband IF noise. The narrow bandpass of the 30 KC selective IF amplifier reduces the demodulation bandwidth to only 15 KC but is relatively unimportant since the feedback loops extend this bandwidth. The IF signal would then be amplified and limited in limiter amplifier 12 and supplied to the FM demodulator 15. The variable frequency compensation network 16 is used to maintain the flattest FM demodulation response possible and might be used to vary the closed loop demodulation bandwidth from 75 KC to a more moderate 15 KC under poor receiving conditions.

The demodulated output 26 having a restricted demodulation bandwidth due to the selective IF amplifier 11, is fed back to deviate the local oscillator 17 and is mixed with the incoming signal reducing its FM deviation. Since the demodulation bandwidth of the selective IF amplifier 11 is 15 KC due to the narrow 30 KC bandpass, the feedback used to reduce the FM deviation of the IF signal is also used to extend the 15 KC demodulation bandwidth of the FM demodulation to over 53 KC. This permits excellent FM stereo demodulation which requires at least 53 KC of bandwidth. The variable frequency compensation network 16 is provided to obtain a maximally flat demodulation bandwidth of approximately 75 KC at output 26. It can be seen that using large amounts of feedback makes it possible to use very narrow IF selective filtering of only 30 KC and yet still maintain a demodulation bandwidth of over 53 KC.

If the received signal quality degrades, the variable frequency compensation network (Loop Filter) and/or the variable bandwidth bandpass filter can be used to reduce the demodulator's noise bandwidth, thereby improving demodulation quality. The demodulation bandwidth can also be deliberately reduced toward 15 KC providing high quality stereo blending to monaural reception.

In the embodiment of FIG. 3, a second group of components is added consisting of: first mixer 96, first selective IF amplifier 97, first variable frequency compensation network (Loop Filter) 103, and first local oscillator 104. These are used as a FM deviation compression loop to improve receiver selectivity or to reduce very high FM deviation input signals to a more moderate FM deviation. A FM deviation of 150 KC could be reduced to 90 KC to permit using a 180 KC bandwidth in first selective IF amplifier 97 for example. This could be reduced under poor receiving conditions. The input 115 on first local oscillator 104 could be used for very rapid tuning of the oscillator for other applications of signal demodulation.

This invention also bears comment about stereo blending. Blending is desired because it helps reduce stereo noise and does not switch noticeably from stereo to mono as do existing stereos. This does not improve sensitivity, however, it does improve circuit performance. Because the demodulation bandwidth is not being reduced before or within the demodulator, there is a limited improvement in performance.

The present invention automatically blends from stereo into mono by reducing the demodulator's demodulation bandwidth, cutting out the stereo subcarrier channel information. This design can be used with any FM stereo demodulator IC chip. Interestingly, the stereo channel separation is reduced but is not completely removed. In other words the receiver does not go completely to mono. The noise is reduced greatly while the stereo separation is not completely removed. In other applications such as cellular phones the audio would become less crisp and more muffled but the noise would be less also. It would be better for the signal to be difficult to understand than to be completely muted out because of noise.

The preferred embodiments set forth herein can be used for either narrow or very wide band FM demodulation by scaling each component to meet the desired criterion. With appropriate circuit parameters specified, such a system according to the present invention would yield comparable benefits for either application. Wider demodulation bandwidths could be obtained similarly by increasing IF frequency and IF filter bandwidths. Increasing feedback within the demodulator would provide the widest demodulation bandwidth possible.

Although the invention has been described with references to particular means and embodiments, it is to be understood that the invention is not limited to the particulars disclosed and extends to all substitutes and equivalents included within the scope of the claims.

What is claimed is:

1. A FM demodulator utilizing FM deviation compression feedback comprising:

a local oscillator supplying local oscillations;

a mixer means having an input receiving an FM signal of prescribed FM deviation and an input receiving said local oscillations and converting said FM signal to a converted IF output signal having a prescribed reduced FM deviation;

an IF amplifier comprising at least one stage coupled to said mixer means output signal for amplifying and selective filtering of said converted IF signal output within a prescribed bandwidth;

a means for coupling an output of said IF amplifier to an FM demodulator, and providing a demodulated output signal to an output terminal of said FM demodulator; and a feedback loop delivering a feedback signal from said output terminal of said FM demodulator to an input of said oscillator for controlling said mixing in said mixer means in a manner as to track said FM signal of prescribed FM deviation, wherein said feedback loop comprises a filter means for reducing said feedback signal at higher demodulation frequencies and increasing said feedback signal at lower demodulation frequencies, thereby reducing the FM deviation of said converted IF signal to the prescribed reduced FM deviation.

2. A FM demodulator as recited in claim 1, in which said IF amplifier is controlled by a bandwidth control.

3. A FM demodulator as recited in claim 1, in which said filter means includes a variable loop filter.

4. A FM demodulator as recited in claim 3, in which said variable loop filter is controlled by a bandwidth control.

5. A FM demodulator as recited in claim 1, in which the said IF amplifier comprises a limiter.

6. A FM demodulator as recited in claim 1, in which the said IF amplifier comprises means responsive to signal strength of at least one converted IF signal providing an output signal.

7. A method of demodulating a FM signal comprising the steps of:

controlling a local oscillator signal on the basis of an output signal obtained from a proportional-plus-integral-type loop filter;

mixing an FM signal of a prescribed FM deviation in a mixer circuit with said local oscillator signal so as to convert said FM signal to a converted IF signal having a prescribed deviation slope;

selectively filtering and amplifying said converted IF signal;

FM demodulating said selectively filtered converted IF signal;

delivering said demodulated IF signal through said loop filter; and controlling said local oscillator signal on the basis of the output signal obtained from said loop filter and providing an output.

8. A FM demodulator utilizing FM deviation compression feedback comprising:

a first mixer means, comprising an input receiving a FM signal of prescribed FM deviation and an input receiving first local oscillations, for converting the FM signal to a first converted IF signal having a first prescribed reduced FM deviation;

a first local oscillator supplying said first local oscillations to said first mixer means and having an output terminal and an input terminal;

a first IF amplifier comprising at least one stage coupled to said first mixer means output for amplifying and selective filtering of said first converted IF signal to within a first prescribed bandwidth, and having an output terminal and an input terminal;

a second mixer means, comprising an input terminal coupled to the output terminal of the first IF amplifier and an input receiving second local oscillations, for converting the amplified and selectively filtered first converted IF signal to a second converted IF signal which has a second prescribed reduced FM deviation lower than said first prescribed reduced FM deviation;

a second local oscillator supplying said second local oscillations to said second mixer means, and having an output terminal and an input terminal;

a second IF amplifier comprising at least one stage coupled to the output terminal of said second mixer means for amplifying and selectively filtering of said second converted IF signal to within a second prescribed bandwidth;

a means for coupling said converted IF signal to an FM demodulator, and providing a demodulated output signal to an output terminal of said FM demodulator;

a first feedback loop coupling said output terminal of said FM demodulator back to said input terminal of said first local oscillator for controlling said first local oscillations, thereby reducing the FM deviation of said received input FM signal of prescribed FM deviation to said first prescribed reduced FM deviation of the converted first IF signal;

a second feedback loop coupling said output terminal of said FM demodulator back to said input terminal of said second local oscillator for controlling said second local oscillations, thereby reducing the FM deviation of the amplified and selectively filtered first converted IF signal to the second prescribed reduced FM deviation, wherein at least one of said first and second feedback loops comprises a filter means for reducing said feedback signal at higher demodulation frequencies and increasing said feedback signal at lower demodulation frequencies.

9. A FM demodulator as recited in claim 8, in which the first and second IF amplifiers comprise means responsive to signal strength of at least one converted IF signal providing an output signal.

10. A FM demodulator as recited in claim 8, wherein a second frequency compensation network is interposed between the FM demodulator and the second local oscillator.

11. A FM demodulator as recited in claim 10, wherein said second frequency compensation network is a second variable loop filter.

12. A FM demodulator as recited in claim 8, in which said first local oscillator provides means for band switching or band tuning.

13. A FM demodulator as recited in claim 10, wherein a first frequency compensation network is interposed between the second frequency compensation network and the input terminal of said first local oscillator.

14. A FM demodulator as recited in claim 13, wherein said first frequency compensation network is a first variable loop filter.

15. A FM demodulator as recited in claim 14, having a bandwidth control for controlling said IF amplifiers and said first loop filter in a fashion as to reduce said demodulation bandwidth to a prescribed reduced demodulation bandwidth.

16. A FM demodulator as recited in claim 1, including means for detecting said received signal condition and evaluating said detected signal providing a bandwidth control signal.

17. A FM demodulator as recited in claim 1, wherein said filter means causes a deviation slope in the IF amplifier.

18. A FM demodulator as recited in claim 1, wherein said filter means comprises a proportional-plus-integral-type filter.

19. A method of demodulating a FM signal as recited in claim 7, further comprising the step of de-emphasizing said demodulated IF signal by passing said demodulated signal through said proportional-plus-integral-type filter.

20. A FM demodulator as recited in claim 13, wherein said first frequency compensation network comprises a proportional-plus-integral-type filter.

21. A FM demodulator as recited in claim 10, wherein said second frequency compensation network comprises a proportional-plus-integral-type filter.

22. A method of demodulating a FM signal as recited in claim 7, wherein said loop filter is a variable loop filter.

23. A FM demodulator as recited in claim 11, having a bandwidth control for controlling said IF amplifiers and said second loop filter in a fashion as to reduce said demodulation bandwidth to a prescribed reduced demodulation bandwidth.

* * * * *